US006985364B2

(12) United States Patent
Higashitani et al.

(10) Patent No.: US 6,985,364 B2
(45) Date of Patent: Jan. 10, 2006

(54) VOLTAGE CONVERTER MODULE

(75) Inventors: Hiroshi Higashitani, Osaka (JP); Masaaki Hayama, Nara (JP); Yuji Mido, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 184 days.

(21) Appl. No.: 10/470,552

(22) PCT Filed: Oct. 4, 2002

(86) PCT No.: PCT/JP02/10361

§ 371 (c)(1),
(2), (4) Date: Jul. 30, 2003

(87) PCT Pub. No.: WO03/032389

PCT Pub. Date: Apr. 17, 2003

(65) Prior Publication Data
US 2004/0070950 A1 Apr. 15, 2004

(30) Foreign Application Priority Data
Oct. 5, 2001 (JP) .............................. 2001-309597

(51) Int. Cl.
H05K 7/06 (2006.01)
H01L 23/52 (2006.01)
(52) U.S. Cl. ...................... 361/763; 361/764; 361/793; 257/700; 257/724
(58) Field of Classification Search ................ 361/761, 361/764, 793
See application file for complete search history.

(56) References Cited

U.S. PATENT DOCUMENTS

| 5,841,193 | A | * | 11/1998 | Eichelberger ................ 257/723 |
| 5,877,550 | A | * | 3/1999 | Suzuki ........................ 257/700 |
| 6,038,133 | A | * | 3/2000 | Nakatani et al. ............. 361/760 |
| 6,366,467 | B1 | * | 4/2002 | Patel et al. .................. 361/760 |
| 6,538,210 | B2 | * | 3/2003 | Sugaya et al. ............... 174/258 |
| 6,630,727 | B1 | * | 10/2003 | Tutsch et al. ................ 257/668 |
| 6,734,542 | B2 | * | 5/2004 | Nakatani et al. ............. 257/687 |
| 2003/0057544 | A1 | * | 3/2003 | Nathan et al. ............... 257/700 |

FOREIGN PATENT DOCUMENTS

| JP | 8-88474 | 4/1996 |
| JP | 2002-233140 | 8/2002 |

* cited by examiner

Primary Examiner—John B. Vigushin
(74) Attorney, Agent, or Firm—McDermott Will & Emery LLP

(57) ABSTRACT

A voltage converter module is formed by multi-layering a first connecting layer, a first inner wiring layer, a component built-in layer, a second inner wiring layer, a second connecting layer, and a capacitor-mounted layer, and a capacitor built-in layer with resin composite. A connecting terminal formed on a terminal surface of the first connecting layer, the first inner wiring layer, the second inner wiring layer and the capacitor-mounted layer are electrically coupled to each other through via-hole conductors. The second inner wiring layer couples a voltage converter IC to peripheral components, both being incorporated in the component built-in layer. A first capacitor and a second capacitor incorporated in the capacitor built-in layer are mounted to the capacitor-mounted layer. This structure forms a circuit, in which the first capacitor is coupled to the second capacitor, between the voltage converter IC and the grounding.

20 Claims, 8 Drawing Sheets

VOLTAGE CONVERTER MODULE

TECHNICAL FIELD

The present invention relates to a voltage conversion module to be used in information communication devices and mobile communication devices.

BACKGROUND ART

FIG. 11 shows a conventional voltage converter circuit. In FIG. 11, voltage converter IC 143, capacitor 141 and capacitor 142 are placed on a layer, namely, they are placed in two dimensions. Voltage converter IC 143 converts a voltage, and each one of capacitors 141, 142 has a capacity of not less than 1 $\mu$F and are coupled between IC 143 and the grounding, thereby removing noises.

Since capacitors 141 and 142 have a capacity of not less than 1 $\mu$F, they are large in dimensions, so that the layout of IC 143, capacitor 141 and capacitor 142 is restricted when they are mounted in the two dimensions. Therefore, this place problem limits those capacitors to make full use of their noise-removing ability, which should have been effective if they had been placed immediately close to the voltage converter IC.

A height of those capacitors, which are chip components, determines a height of the entire circuit, and a total cross sectional area in a horizontal direction of the voltage-converter IC and the capacitors determines an area occupied by the entire circuit.

DISCLOSURE OF THE INVENTION

The present invention aims to provide a compact and low-profile voltage converter module in which a voltage-converter IC and capacitors coupled to the IC are closely placed to each other in three dimensions for making the most of its excellent noise-removing ability.

The voltage converter module of the present invention comprises the following members stacked by resin composite:
  a first connecting layer;
  a first inner wiring layer;
  a component built-in layer;
  a second inner wiring layer;
  a second connecting layer;
  a capacitor-mounted layer;
  a capacitor built-in layer; and
  components.

To be more specific, the foregoing members are constructed as follows:
  (a) the first connecting layer includes a terminal layer having connecting terminals;
  (b) the first inner wiring layer includes a wiring pattern to be coupled to the connecting terminal through a first via-hole conductor included in the first connecting layer, and the wiring pattern is overlaid on the face of the first connecting layer;
  (c) the component built-in layer is overlaid on the first inner wiring layer and includes a second via-hole conductor, and incorporates the voltage converter IC and peripheral components;
  (d) the second inner wiring layer is overlaid on the component built-in layer, and coupled electrically through the second via-hole conductor to the wiring pattern included in the first inner wiring layer, and includes a wiring pattern to be coupled electrically to the voltage converter IC;
  (e) the second connecting layer is overlaid on the second inner wiring layer and includes a third via-hole conductor;
  (f) the capacitor-mounted layer is overlaid on the second connecting layer and electrically coupled, through the third via-hole conductor, to the wiring pattern included in the second inner wiring layer, so that a first capacitor and a second capacitor are electrically coupled to each other; and
  (g) the capacitor built-in layer is overlaid on the capacitor-mounted layer, thereby integrating the first and the second capacitors.

The foregoing structure thus includes a circuit, in which the first capacitor and the second capacitor are coupled to each other, between the voltage converter IC and the grounding. In addition to this, a terminal of the voltage converter IC is electrically coupled to terminals of peripheral components through the wiring pattern of the second inner wiring layer.

Further, the voltage converter IC, the first capacitor and the second capacitor are electrically coupled to each other through the wiring pattern of the second inner wiring layer, the third via-hole conductor and the wiring pattern of the capacitor-mounted layer.

The connecting terminal is coupled to an input/output terminal, communicating signals to/from an external circuit, of the voltage converter module through the first via-hole conductor and the wiring pattern of the first inner wiring layer.

The structure discussed above realizes a compact and low profile voltage converter circuit in a form of module excellent in removing noises.

PREFERRED EMBODIMENTS OF THE INVENTION

Exemplary Embodiment 1

Figure 1:
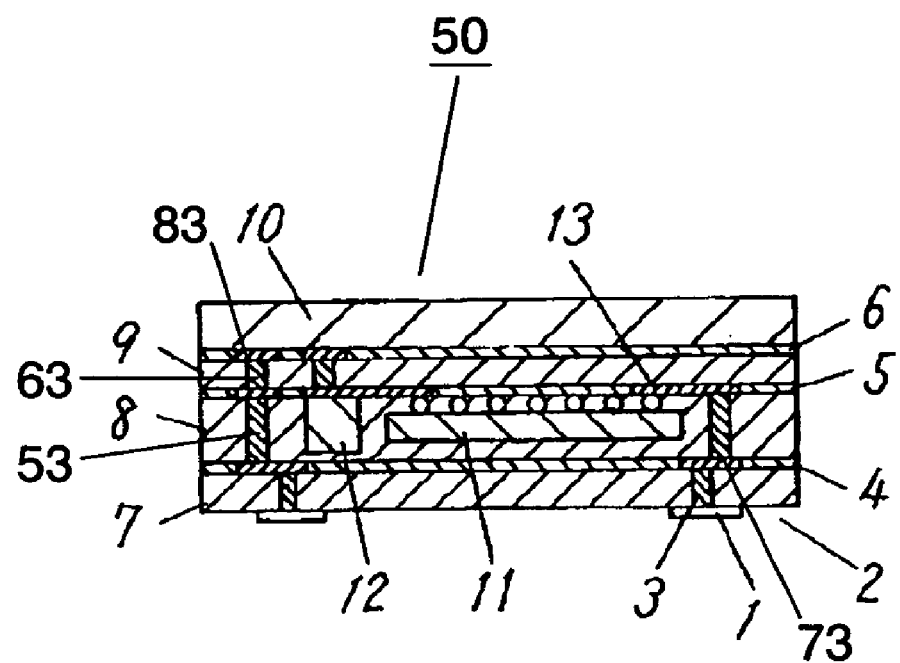
FIG. 1 shows a sectional view illustrating a structure of a voltage converter module in accordance with a first exemplary embodiment of the present invention.
Figure 2:
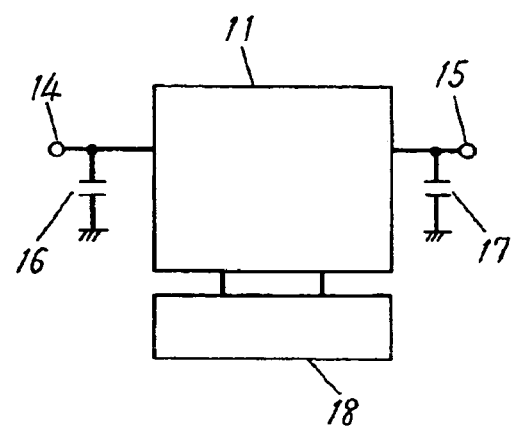
FIG. 2 is a circuit diagram of the voltage converter module in accordance with the first embodiment.

FIG. 1 shows a sectional view illustrating a structure of a voltage converter module in accordance with the first exemplary embodiment of the present invention. FIG. 2 is a circuit diagram of the voltage converter module. In FIGS. 1 and 2, voltage converter IC 11 converts a voltage. First capacitor 16 is coupled between input terminal 14 of IC 11 and the grounding. Second capacitor 17 is coupled between output terminal 15 and the grounding. First and second capacitors 16, 17 are used for removing noises.

Terminal surface 2 is placed at the lowest position of voltage converter module 50 and includes connecting terminals 1 for coupling to an external signal.

Terminals placed on terminal surface 2 are electrically coupled to wiring pattern 73 formed on first inner wiring layer 4 through via-hole conductor 3. Meanwhile the via-hole conductor formed on first connecting layer is called a first via-hole conductor.

Voltage converter IC 11 is integrated in component built-in layer 8 and mounted on second inner wiring layer 5. Further, chip components forming peripheral circuit 18 of IC 11, such as resistors, capacitors and inductors are also integrated in layer 8, and mounted on inner wiring layer 5. Those components including voltage converter IC 11 are electrically coupled to each other with wiring pattern 13 formed on inner wiring layer 5.

Wiring pattern 7 formed on first inner wiring layer 4 is coupled to wiring pattern 13 on second inner wiring layer 5 through via-hole conductor 53 formed in component built-in layer 8 (a via-hole conductor formed in layer 8 is called a second via-hole conductor).

Wiring pattern 13 on second inner wiring layer 5 is coupled to wiring pattern 83 on capacitor-mounted layer 6 through via-hole conductor 63 (a via-hole conductor formed in second connecting layer 9 is called a third via-hole conductor).

Capacitor built-in layer 10 is placed on capacitor-mounted layer 6, namely, the upper most location of module 50. Layer 10 incorporates first capacitor 16 and second capacitor 17, and those two capacitors are electrically coupled to wiring pattern 83 on capacitor-mounted layer 6.

Module 50 is thus formed by multi-layering the wiring patterns and insulating-resin layers with resin composite.

A terminal of voltage converter IC 11 or chip component 12 are electrically coupled to connecting terminal 1 by using wiring pattern 73 formed on first inner wiring layer 4, wiring pattern 13 on second inner wiring layer 5, first via-hole conductor 3, and second via-hole conductor 53.

Voltage converter IC 11, first and second capacitors 16, 17 are electrically coupled to each other by using wiring pattern 13 formed on second inner wiring layer 5 and wiring pattern 83 formed on capacitor-mounted layer 6, and third via-hole conductor 63.

First inner wiring layer 4, second inner wiring layer 5 and connecting terminal 1 of capacitor-mounted layer 6, first capacitor 16 and second capacitor 17 are electrically coupled to each other.

Figure 3:
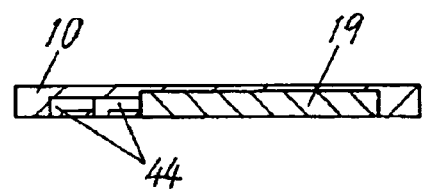
FIG. 3 shows a sectional view illustrating a structure of a capacitor built-in layer in accordance with the first embodiment.
Figure 4:
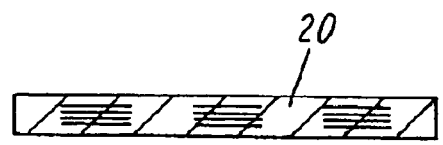
FIG. 4 shows a sectional view illustrating a structure of another capacitor built-in layer.

FIGS. 3 and 4 show sectional views illustrating structures of capacitor built-in layer 10. Capacitor built-in layer 10 incorporates first capacitor 16 and second capacitor 17.

First and second capacitors 16, 17 are, for instance, formed of capacitor 19 made of conductive polymer. To be more specific, electrolytic capacitors, of which electrolyte is made of highly conductive polymer, i.e., functional polymer, and of which electrodes are made of aluminum or tantalum, may be used as first and second capacitors 16, 17. The functional polymer often uses polypyrrole or polythiophene.

Capacitor 19 is simply a single element or shaped like a surface mounting package, and mounted on layer 6 before being coupled to the wiring pattern through connecting terminals 44. Capacitor 19 can be bonded onto layer 6 with resin composite. First and second capacitors 16, 17 can be ceramic capacitors.

Figure 5:
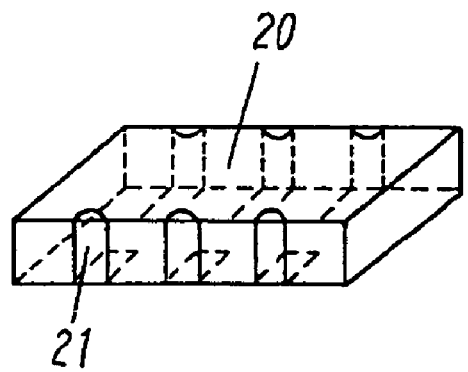
FIG. 5 shows a perspective view illustrating a structure of another capacitor built-in layer.

For instance, as shown in FIG. 4, capacitor built-in layer 10 is formed of ceramic board, and ceramic capacitors are formed of ceramic capacitor layer 20 in which three capacitors are placed in parallel. As shown in FIG. 5, respective capacitors 20 have end-face electrodes 21, which are coupled to the wiring pattern on layer 6 mounted with capacitors.

Voltage converter IC 11 is shaped like a bare-chip or a package, and mounted in module 50 with resin composite. Connecting terminal 1, which couples an external circuit to an input/output section of a circuit using voltage converter IC 11, may be formed as an end-face electrode on the end face of module 50.

The capacitors, resistors and inductors forming peripheral circuit 18 may be constructed as follows:

(1) Capacitor: A resin board having a high dielectric constant or a ceramic board is used in second connecting layer 9, so that a parallel flat-board capacitor is formed.

(2) Resistor and Inductor: They are formed on the second inner wiring layer by printing and etching.

Figure 9:
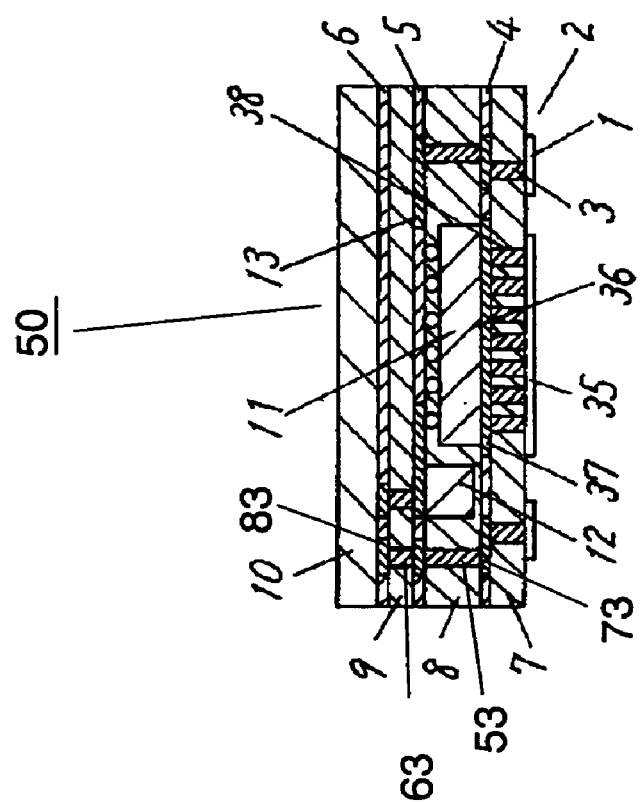
FIG. 9 is a sectional view illustrating a structure of another voltage converter module.

The following structure facilitates heat dissipation. As shown in FIG. 9, opposite face 36 to the face, having terminals of voltage converter IC 11 integrated in component built-in layer 8, is coupled to copper foil pattern 37 formed on first inner wiring layer 4. Copper foil pattern 37 is coupled to heat dissipating plate 35 formed on terminal surface 2 through heat dissipating via-hole conductor 38 formed in first connecting layer 7. This construction allows the heat, generated in the component built-in layer including IC 11, to be dissipated. The heat dissipation stabilizes the operating temperature, so that the voltage converter circuit operates in a stable manner.

Figure 10:
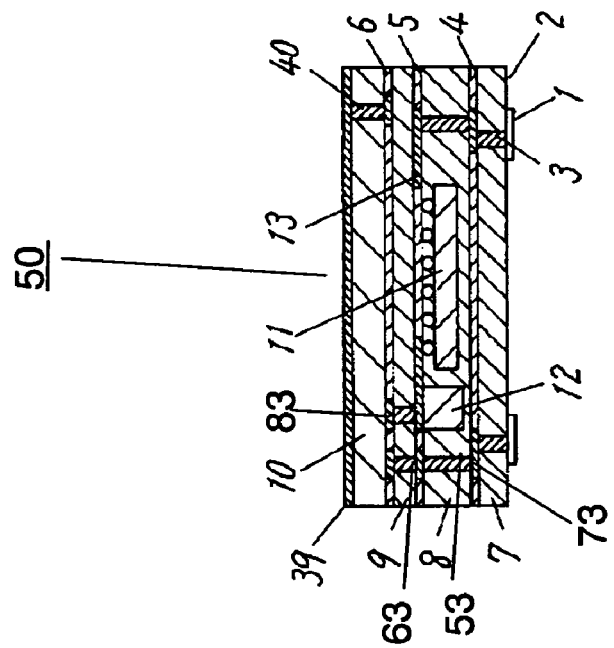
FIG. 10 is a sectional view illustrating a structure of still another voltage converter module.
Figure 11:
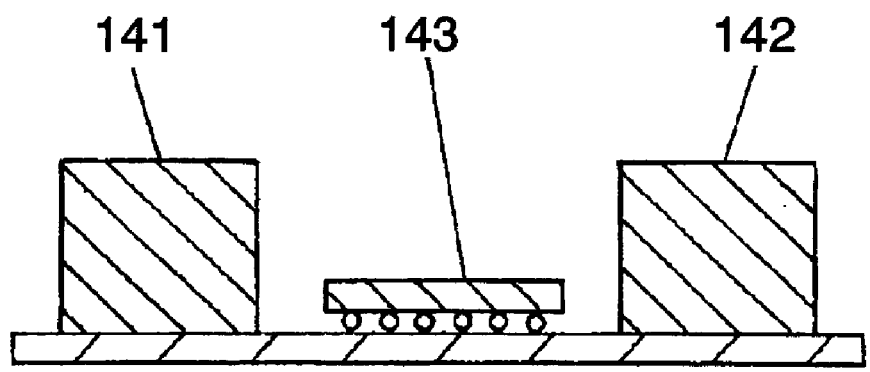
FIG. 11 is a sectional view illustrating a structure of a conventional voltage converter module.

The following structure facilitates electromagnetic shielding. As FIG. 10 shows, via-hole conductor 40 is formed for coupling a shielding plate in capacitor built-in layer 10, further, shielding plate 39 is coupled to the upper face of layer 10. Via-hole conductor 40 connects a grounding pattern on capacitor-mounted layer 6 to shielding plate 39, so that electromagnetic shield is provided to the circuits integrated in module 50. Noises radiated from the voltage converter circuit is thus electromagnetically shielded, and adverse effect to an external circuit due to the noises can be reduced.

As above described, the voltage converter IC and the capacitors connected thereto are mounted in three dimensions, so that a compact and low profile voltage converter module with improved noise-removing ability is obtainable.

Exemplary Embodiment 2

Figure 6:
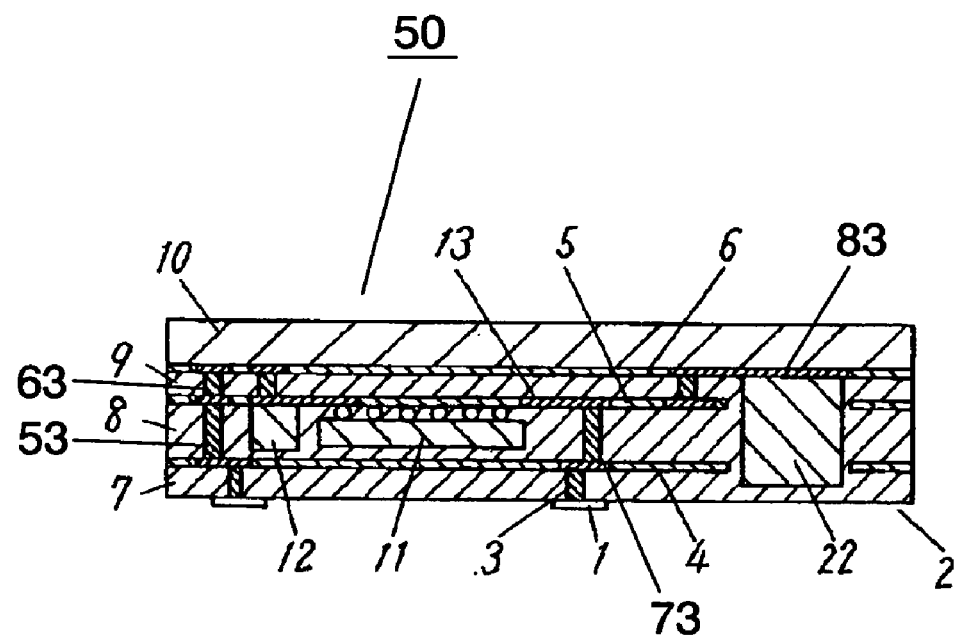
FIG. 6 shows a perspective view illustrating a structure of a voltage converter module in accordance with a second exemplary embodiment of the present invention.
Figure 7:
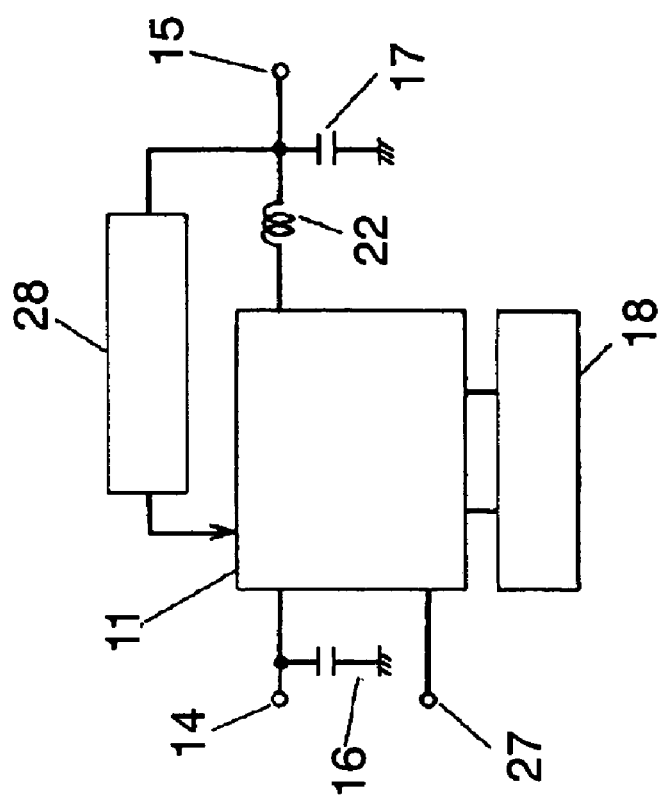
FIG. 7 is a circuit diagram of the voltage converter module in accordance with the second and a third embodiment.

FIG. 6 shows a sectional view illustrating a structure of a voltage converter module in accordance with the second exemplary embodiment of the present invention. FIG. 7 shows the circuit diagram of the module.

In FIGS. 6 and 7, between input terminal 14 inputting a signal to voltage converter IC 11 and the grounding, first capacitor 16 is coupled for removing noises. Inductor 22 is coupled in series between output terminal 15 and the output terminal of voltage converter IC 11. Between output terminal 15 and the grounding, second capacitor 17 is coupled. Inductor 22 and second capacitor 17 form a smoothing circuit.

Terminal surface 2 is placed at the lowest position of module 50, and includes connecting terminal 1 for communicating signals to/from an external circuit.

A terminal prepared on terminal surface 2 is electrically coupled to wiring pattern 73 formed on first inner wiring layer 4 through first via-hole conductor 3 formed in first connecting layer 7.

Voltage converter IC 11 is integrated in component built-in layer 8 and mounted onto second inner wiring layer 5. Further, chip components 12 such as resistors, capacitors and inductors are incorporated in component built-in layer 8 and mounted on second inner wiring layer 5. IC 11 and those components forming peripheral circuit 18 are electrically coupled to each other by wiring pattern 13 formed on inner wiring layer 5.

Wiring pattern 73 on first inner wiring layer 4 is coupled to wiring pattern 13 on second inner wiring layer 5 through second via-hole conductor 53 formed in component built-in layer 8.

Wiring pattern 13 formed on second inner wiring layer 5 is coupled to wiring pattern 83 on capacitor-mounted layer 6 through third via-hole conductor 63 formed in second connecting layer 9.

Capacitor built-in layer 10 is placed on capacitor-mounted layer 6, namely, at the upper most position of module 50. Layer 10 incorporates first capacitor 16 and second capacitor 17, and those capacitors are electrically coupled to wiring pattern 83 formed on capacitor-mounted layer 6.

Module 50 is thus formed by multi-layering insulating-resin layers and layers including wiring patterns with resin composite.

Smoothing inductor 22 is mounted on layer 6 or second inner wiring layer 5, so that it is incorporated in the layer stretching from first connecting layer 7 to second connecting layer 9.

The foregoing construction is thus similar to that of the first embodiment except the presence of inductor 22.

Connecting terminal 1 and a terminal of voltage converter IC 11 or chip component 12 are electrically coupled to connecting terminal 1 by using wiring pattern 73 on first inner wiring layer, wiring pattern 13 on second inner wiring layer 5, first via-hole conductor 3, and second via-hole conductor 53.

Voltage converter IC 11, first and second capacitors 16, 17, and smoothing inductor 22 are electrically coupled to each other by using wiring pattern 13 on second inner wiring layer 5, wiring pattern 83 on layer 6 mounted with capacitors, and third via-hole conductor 63. Inductor 22 is coupled to wiring pattern 13 formed on second inner wiring layer 5 or wiring pattern 83 formed on capacitor-mounted layer 6.

Connecting terminal 1, first and second capacitors 16, 17, and smoothing inductor 22 are electrically coupled to each other by using first inner wiring layer 4, second inner wiring layer 5, the wiring pattern formed on capacitor-mounted layer 6, and first, second, third via-hole conductors.

Similar to the first embodiment, voltage converter IC 11 is shaped like a bare-chip or a package, and mounted in module 50 with resin composite.

Similar to the first embodiment, first and second capacitors 16, 17 are formed of capacitors, e.g., using conductive polymer as shown in FIG. 3. Those capacitors may be, e.g., ceramic capacitors as shown in FIG. 4.

Similar to the first embodiment, resistors, capacitors and inductors forming peripheral circuit 18 are formed on second connecting layer 9 by using a ceramic board.

As described in the first embodiment, the structure shown in FIG. 9 can be used so that the heat generated in the component built-in layer including voltage converter IC 11 can be efficiently dissipated.

As described in the first embodiment, the structure shown in FIG. 10 can be used so that electromagnetic shield can work efficiently.

Similar to peripheral circuit 18, feedback circuit 28 can be constructed by chip components and coupled to IC 11 by using wiring pattern 13 formed on second inner wiring plate 5. Feedback circuit 28 is integrated into component built-in layer 8.

IC 11 can include output-voltage controlling terminal 27, which is electrically coupled to connecting terminal 1 through wiring pattern 13 formed on second wiring plate 5, second via-hole conductor, wiring pattern 73 first inner wiring plate 5, and first via-hole conductor. The output terminal of IC 11 can be thus controlled from the outside of module 50.

As described above, a compact and low-profile voltage converter module including a voltage converter circuit having a large power capacity is obtainable, and the performance of removing noises is improved.

Exemplary Embodiment 3

Figure 8:
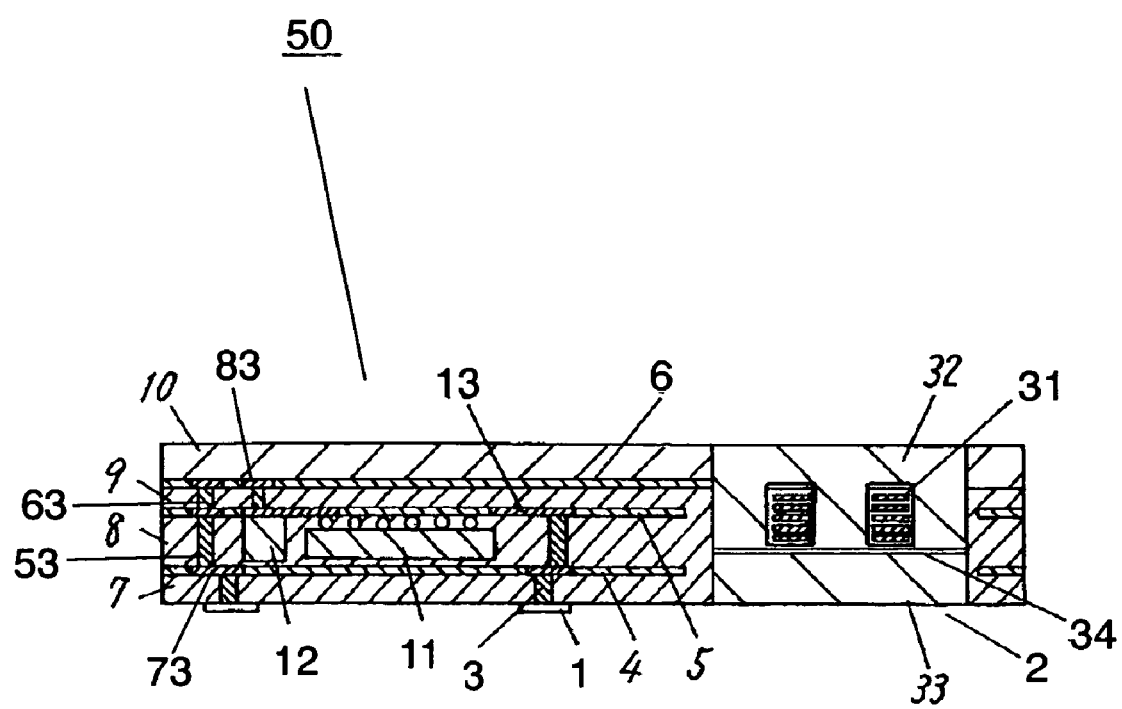
FIG. 8 is a sectional view illustrating a structure of a voltage converter module in accordance with the third exemplary embodiment of the present invention.

FIG. 8 shows a sectional view illustrating a structure of a voltage converter module in accordance with the third exemplary embodiment of the present invention. FIG. 7 shows the circuit diagram of the module, namely, the third embodiment uses the same circuit as that of the second embodiment.

In order to obtain DC superposition characteristics and a high inductor value, smoothing inductor 22 is formed of a coil and magnetic material such as a ferrite core.

A coil shown in FIG. 8 is constructed as follows: Helical line 31 is included in a layer disposed over at least one of first connecting layer 7, component built-in layer 8 and second connecting layer 9. Helical spiral line 31 is, for instance, constructed as follows: a spiral-coil pattern made of conductor is formed on an insulating resin layer. This pattern is coupled to another spiral-coil pattern formed in the next layer through the via-hole conductor formed in the insulating resin layer such that they form a coil.

In a similar way, plural spiral-coil patterns are coupled to each other, so that the helical line 31 shown in FIG. 8 is formed.

A ferrite core is constructed as follows in order to sandwich helical line 31. Upper ferrite core 32 and lower ferrite core 33 sandwich helical line 31 from the upper side and the lower side of module 50 respectively. Further, ferrite cores 32 and 33 sandwich insulating layer 34 so that cores 32 and 33 can retain a given space in between.

Coil 22 thus constructed is coupled to IC 11 and other circuit elements in the following way: A terminal of coil 22 is electrically coupled to a wiring pattern formed on insulating layer 34. This wiring pattern is coupled to an end-face electrode prepared on the outer rim of the ferrite core, and this end-face electrode is coupled to wiring pattern 13 formed on second inner wiring layer. Voltage converter IC 11 is thus electrically coupled to coil 22.

Similar to the first and the second embodiments, first and second capacitors 16, 17 can be constructed as shown in FIGS. 3 and 4.

Similar to the first and the second embodiments, the structure shown in FIG. 9 can be used so that the heat generated in the component built-in layer including voltage converter IC 11 can be efficiently dissipated.

As described in the first and the second embodiments, the structure shown in FIG. 10 can be used so that electromagnetic shield can work efficiently.

As above described, a compact and low profile voltage converter module including a voltage converter circuit having a large power capacity is obtainable. The module shows an improved performance of removing noises, and has excellent DC superposition characteristics.

INDUSTRIAL APPLICABILITY

According to the present invention, a voltage converter IC, capacitors, and chip components such as resistors, capacitors and inductors which are used in a peripheral circuit coupled to the voltage converter IC are disposed in three dimensions by using resin composite. A voltage converter circuit thus formed realizes the compact and low profile circuit. Further, a length of conductors that connect the voltage converter IC and the capacitors can be shortened, so that performance of removing noises can be improved.

What is claimed is:

1. A voltage converter module formed of multi-layers with resin composite, the module comprising:
   (a) a first connecting layer of which terminal-surface includes a connecting terminal;
   (b) a first inner wiring layer being overlaid on an opposite face to the terminal-surface of the first connecting layer and having a wiring pattern to be electrically coupled to the connecting terminal through a first via-hole conductor included in said first connecting layer;
   (c) a component built-in layer incorporating a voltage converter IC and a peripheral component, and being overlaid on said first inner wiring layer, and including a second via-hole conductor;
   (d) a second inner wiring layer being overlaid on said component built-in layer, and being electrically coupled to the wiring pattern of said first inner wiring layer through the second via-hole conductor, and having a wiring pattern to be electrically coupled to the voltage converter IC;
   (e) a second connecting layer being overlaid on said second wiring layer and including a third via-hole conductor;
   (f) a capacitor-mounted layer being overlaid on said second connecting layer, and being electrically coupled to the wiring pattern of said second inner wiring layer through the third via-hole conductor, and having a wiring pattern where a first capacitor and a second capacitor are electrically coupled to each other; and
   (g) a capacitor built-in layer being overlaid on said capacitor-mounted layer, and incorporating the first capacitor and the second capacitor,
   wherein the module includes a circuit, in which the first capacitor and the second capacitor are coupled to each other, between a terminal of the voltage converter IC and a grounding,
   wherein the terminal of the voltage converter IC is electrically coupled to a terminal of the peripheral component through the wiring pattern of said second inner wiring layer,
   wherein the voltage converter IC, the first capacitor and the second capacitor are coupled to each other through the wiring pattern of said second inner wiring layer, the third via-hole conductor and the wiring pattern of said capacitor-mounted layer, and
   wherein the connecting terminal is electrically coupled to a connecting terminal, which is coupled to an external circuit, of the circuit through the first via-hole conductor and the wiring pattern of said first inner wiring layer.

2. The voltage converter module of claim 1, wherein the first capacitor and the second capacitor are made of conductive polymer.

3. The voltage converter module of claim 1, wherein said capacitor built-in layer is a ceramic capacitor layer including a plurality of capacitors, which have respective end-face electrodes that are electrically coupled to the wiring pattern of said capacitor-mounted layer.

4. The voltage converter module of claim 1, wherein an inductor is electrically coupled to one of the wiring pattern of said capacitor-mounted layer and the wiring pattern of said second inner wiring layer, and the inductor is incorporated in a layer stretching from said first connecting layer to said second connecting layer,
   wherein the voltage converter IC is electrically coupled to the inductor, and
   wherein the inductor is coupled in series between the output terminal and an output terminal of the voltage converter IC, and the second capacitor is electrically coupled between the output terminal and the grounding for forming a smoothing circuit.

5. The voltage converter module of claim 4, wherein the inductor includes a coil, an upper magnetic member, and a lower magnetic member,
   wherein the coil is formed by a plurality of spiral lines coupled to each other through a via-hole conductor in a layer disposed over at least one of said first connecting layer, said component built-in layer and said second connecting layer, and
   wherein an insulating layer is disposed between the upper magnetic member and the lower magnetic member, and both the members sandwich the spiral lines.

6. The voltage converter module of claim 1, wherein a face opposite to a face having a terminal of the voltage converter IC is coupled to a copper-foil pattern formed on said first inner wiring layer, and also coupled to a heat dissipating plate disposed on the end-face through a heat dissipating via-hole conductor formed in said first connecting layer.

7. The voltage converter module of claim 1, wherein said capacitor built-in layer includes a via-hole conductor to be used for coupling a shielding plate, which is coupled to an upper face of said capacitor built-in layer, and the shielding plate is coupled to said capacitor-mounted layer through the via-hole conductor to be used for coupling the shielding plate.

8. The voltage converter module of claim 2, wherein a face opposite to a face having a terminal of the voltage converter IC is coupled to a copper-foil pattern formed on said first inner wiring layer, and also coupled to a heat dissipating plate disposed on the end-face through a heat dissipating via-hole conductor formed in said first connecting layer.

9. The voltage converter module of claim 3, wherein a face opposite to a face having a terminal of the voltage converter IC is coupled to a copper-foil pattern formed on said first inner wiring layer, and also coupled to a heat dissipating plate disposed on the end-face through a heat dissipating via-hole conductor formed in said first connecting layer.

10. The voltage converter module of claim 4, wherein a face opposite to a face having a terminal of the voltage converter IC is coupled to a copper-foil pattern formed on said first inner wiring layer, and also coupled to a heat dissipating plate disposed on the end-face through a heat dissipating via-hole conductor formed in said first connecting layer.

11. The voltage converter module of claim 5, wherein a face opposite to a face having a terminal of the voltage converter IC is coupled to a copper-foil pattern formed on said first inner wiring layer, and also coupled to a heat dissipating plate disposed on the end-face through a heat dissipating via-hole conductor formed in said first connecting layer.

12. The voltage converter module of claim 2, wherein said capacitor built-in layer includes a via-hole conductor to be used for coupling a shielding plate, which is coupled to an upper face of said capacitor built-in layer, and the shielding plate is coupled to said capacitor-mounted layer through the via-hole conductor to be used for coupling the shielding plate.

13. The voltage converter module of claim 3, wherein said capacitor built-in layer includes a via-hole conductor to be used for coupling a shielding plate, which is coupled to an upper face of said capacitor built-in layer, and the shielding plate is coupled to said capacitor-mounted layer through the via-hole conductor to be used for coupling the shielding plate.

14. The voltage converter module of claim 4, wherein said capacitor built-in layer includes a via-hole conductor to be used for coupling a shielding plate, which is coupled to an upper face of said capacitor built-in layer, and the shielding plate is coupled to said capacitor-mounted layer through the via-hole conductor to be used for coupling the shielding plate.

15. The voltage converter module of claim 5, wherein said capacitor built-in layer includes a via-hole conductor to be used for coupling a shielding plate, which is coupled to an upper face of said capacitor built-in layer, and the shielding plate is coupled to said capacitor-mounted layer through the via-hole conductor to be used for coupling the shielding plate.

16. The voltage converter module of claim 6, wherein said capacitor built-in layer includes a via-hole conductor to be used for coupling a shielding plate, which is coupled to an upper face of said capacitor built-in layer, and the shielding plate is coupled to said capacitor-mounted layer through the via-hole conductor to be used for coupling the shielding plate.

17. The voltage converter module of claim 8, wherein said capacitor built-in layer includes a via-hole conductor to be used for coupling a shielding plate, which is coupled to an upper face of said capacitor built-in layer, and the shielding plate is coupled to said capacitor-mounted layer through the via-hole conductor to be used for coupling the shielding plate.

18. The voltage converter module of claim 9, wherein said capacitor built-in layer includes a via-hole conductor to be used for coupling a shielding plate, which is coupled to an upper face of said capacitor built-in layer, and the shielding plate is coupled to said capacitor-mounted layer through the via-hole conductor to be used for coupling the shielding plate.

19. The voltage converter module of claim 10, wherein said capacitor built-in layer includes a via-hole conductor to be used for coupling a shielding plate, which is coupled to an upper face of said capacitor built-in layer, and the shielding plate is coupled to said capacitor-mounted layer through the via-hole conductor to be used for coupling the shielding plate.

20. The voltage converter module of claim 11, wherein said capacitor built-in layer includes a via-hole conductor to be used for coupling a shielding plate, which is coupled to an upper face of said capacitor built-in layer, and the shielding plate is coupled to said capacitor-mounted layer through the via-hole conductor to be used for coupling the shielding plate.

\* \* \* \* \*